United States Patent [19]

Brown

[11] Patent Number: 4,622,525
[45] Date of Patent: Nov. 11, 1986

[54] LOW LOSS SURFACE ACOUSTIC WAVE DEVICE AND METHOD

[75] Inventor: Roy B. Brown, Apopka, Fla.
[73] Assignee: Sawtek, Inc., Orlando, Fla.
[21] Appl. No.: 756,510
[22] Filed: Jul. 19, 1985
[51] Int. Cl.$^4$ .................. H03H 9/145; H03H 9/42; H03H 9/76
[52] U.S. Cl. .................. 333/151; 310/313 D; 333/153; 333/194; 333/195
[58] Field of Search .................. 333/150–155, 333/193–196; 310/313 R, 313 A, 313 B, 313 C, 313 D; 29/25.35

[56] References Cited

U.S. PATENT DOCUMENTS 4,263,571 4/1981 Kinoshita et al. .............. 333/195 X
4,309,679 1/1982 Furuya et al. .................. 333/195
4,521,751 6/1985 Riha et al. .................... 333/194 X

*Primary Examiner*—Marvin L. Nussbaum
*Attorney, Agent, or Firm*—Duckworth, Allen, Dyer

[57] ABSTRACT

A surface acoustic wave device in a piezoelectric medium includes input and output transducers for launching and detecting a surface acoustic wave along the piezoelectric medium. The device is arranged in a ring loop to process the bidirectional acoustic wave launched from the input transducer. Multistrip couplers in the ring loop between the input and output transducers are used to achieve low loss characteristics. A phase shift introduced by the multistrip couplers between portions of the surface acoustic wave is used to cancel triple-transit reflections.

19 Claims, 7 Drawing Figures

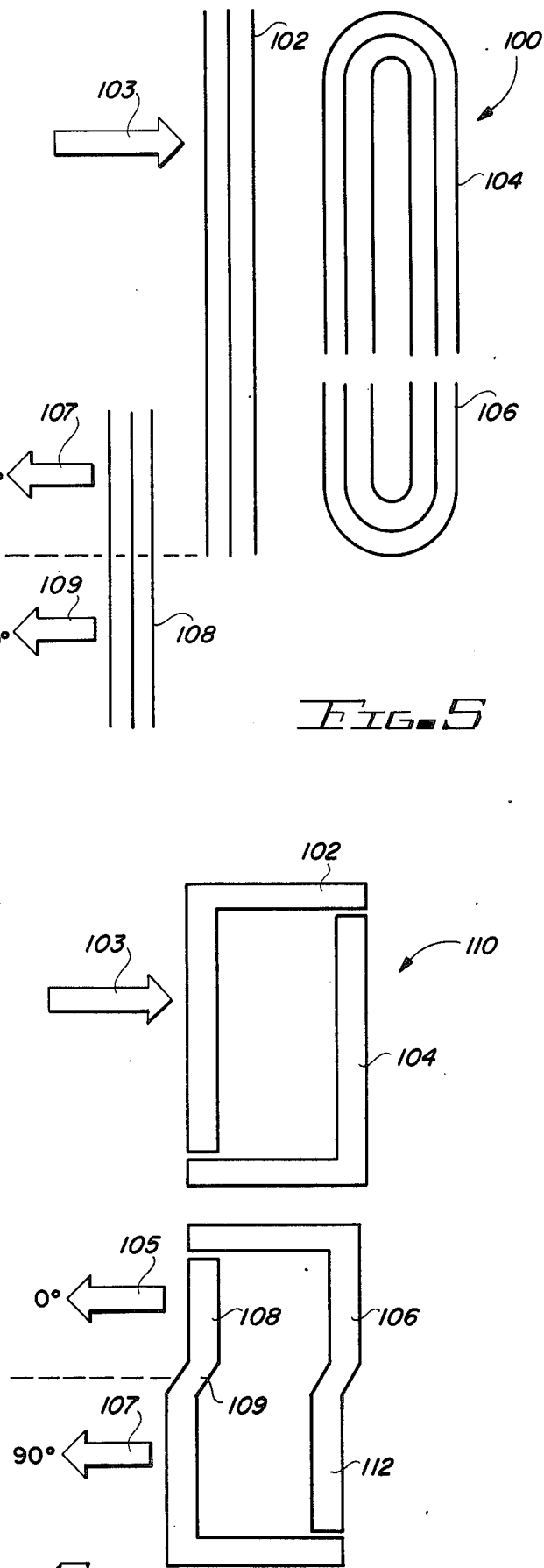

LOW LOSS SURFACE ACOUSTIC WAVE DEVICE AND METHOD

BACKGROUND OF THE INVENTION

1. Field of the Invention

The present invention relates to surface acoustic wave devices and methods relating to such devices, and specifically relates to devices and methods for achieving low loss characteristics and for reducing or cancelling undesirable reflections.

2. Description of the Prior Art

Surface acoustic wave (SAW) devices are well known in the prior art. Typically, a surface acoustic wave device is characterized by an input transducer arranged on a piezoelectric surface, with an output transducer spaced from the input transducer for detecting and processing a surface acoustic wave launched by the input transducer along the piezoelectric surface. A wide variety of surface acoustic wave devices have been devised for accomplishing a number of electronic circuit functions.

The typical input transducer for a surface acoustic wave device launches a surface acoustic wave in two directions. Multistrip couplers can be configured which change the track (path) and direction of the surface acoustic wave launched by the input transducer, permitting all of the energy of the wave launched in both directions to be ultimately directed into the output transducer. See, for example, the following literature reference describing the use of multistrip couplers for these purposes: "Reflecting Trackchanger: New Acoustic-Surface-Wave Component for Folding Long Delay Lines onto Small Substrates," F. G. Marshall, *Electronic Letters*, Vol. 8, pp. 8–9, 1972; "Therory and Design of the Surface Acoustic Wave Multistrip Coupler," F. G. Marshall et al., *IEEE Transactions on Sonics and Ultrasonsics*, Vol. SU-20, No. 2, p.24, April 1973; "Surface Acoustic Wave Multistrip Components and Their Applications," F. G. Marshall et al., *IEEE Transactions on Sonics and Ultrasonics*, Vol SU-20, No. 2, p.134, April 1973; "A New Multistrip Acoustic Surface Wave Filter," M. Feldmann et al., 1974 *Ultrasonics Symposium Proceedings*, IEEE Cat. #74 CHO 896-ISU," p.157; "Surface Acoustic Wave Ring Filter," F. Sandy et al., 1976 *Ultrasonics Symposium Proceedings*, IEEE Cat. No. 76 CH1120-5SU, p.391; and "Design of Multistrip Arrays," M. Feldmann et al., 1977 *IEEE Ultrasonics Symposium Proceedings* IEEE Cat. #77CH1264-ISU, p.686.

As is discussed by M. F. Lewis, et al. in an article entitled "Recent Developments in SAW Devices," *IEE Proceedings, Vol. 131 Part A*, June 1984, a serious problem encountered in SAW devices and particularly in ring loop devices as described above, arises from the triple-transit signals derived from multiple reflections of surface acoustic waves between the input and output transducers. The causes for such undesirable signals are described in that article.

SUMMARY OF THE INVENTION

The present invention provides a surface acoustic wave device and a method for redirecting the acoustic power generated from a bidirectional transducer so that the 3 dB loss for each direction of propagation from the transducer due to bidirectionality is eliminated, while simultaneously cancelling tripletransit ripples and reflections.

This invention is realized in a surface acoustic wave ring device on a piezoelectric medium having input and output transducer means for launching and detecting a surface acoustic wave along the medium. Means are provided for cancelling the undesirable triple-transit reflection characteristics occurring in the acoustic wave between the input and output transducer means. In the preferred embodiment of the present invention, the means for cancelling the undesirable reflection characteristics comprises means for introducing a phase shift between portions of the surface acoustic wave. A variety of different configurations of multistrip couplers are useful for this purpose.

In order to detect the phase shifted portions of the acoustic wave, two distinct output transducers are provided, one of which is electrically coupled with a phase shifting network to shift the phase of one of the outputs so that the outputs from both output transducers are ultimately in phase.

In an alternative arrangement, two distinct input transducers are arranged on the piezoelectric surface, with a phase shifting feature in opposing multistrip couplers on opposite sides of the input transducers. This arrangement cancels spurious reflections in a manner similar to the split output transducers described above.

DESCRIPTION OF THE DRAWINGS

This invention is pointed out with particularity in the appended claims. However, other objects and advantages together with the operation of the invention may be better understood by reference to the following detailed description taken in conjunction with the following illustrations wherein:

FIGS. 3–6 illustrate alternative embodiments of multistrip couplers useful for achieving the low loss characteristics of the present invention, and for cancelling triple-transit reflection characteristics.

DETAILED DESCRIPTION

Figure 1:
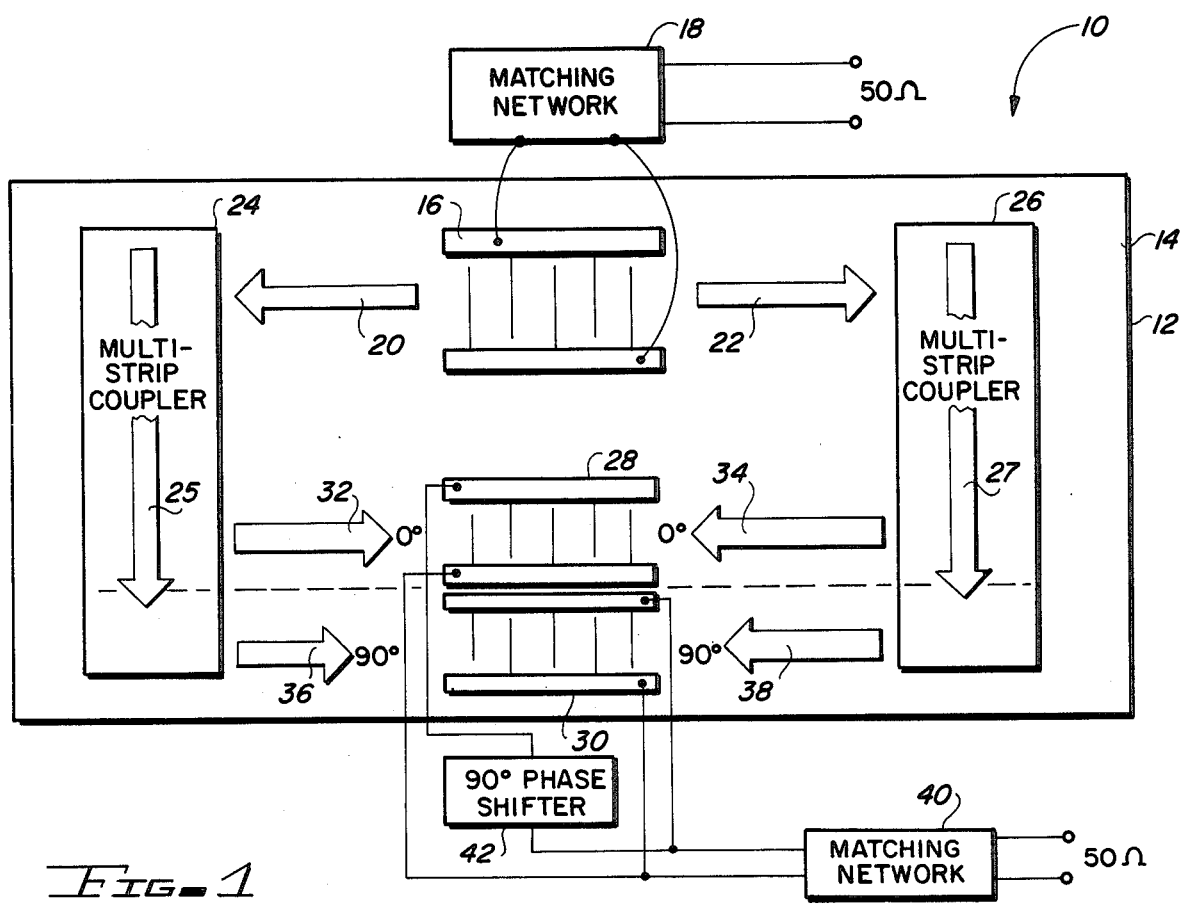
FIG. 1 is a schematic illustration of a surface acoustic wave device in accordance with the present invention.

In FIG. 1, the reference numeral 10 refers generally to a surface acoustic wave (SAW) device 12 on a piezoelectric medium.

The SAW device 10 includes a bidirectional input transducer 16 connected to an external matching network 18 via conventional bonding leads. As is well known, electrical exitation of the transducer 16 will generate bidirectional surface acoustic waves as represented by arrows 20, 22.

Elements 24 and 26 refer to schematic representation of multistrip couplers, which may take a variety of different forms as is described in greater detail below with reference to FIGS. 2–6. The basic function of multistrip couplers is described in the above-cited professional journal references, which are incorporated here by reference.

The multistrip couplers 24 and 26 detect the bidirectional surface acoustic waves 20 and 22 and conduct electrical signals representative of the acoustic waves 20, 22 along the multistrip coupler, as shown by arrows 25, 27. The multistrip couplers 24 and 26 then launch surface acoustic waves (represented by arrows 32, 34, 36 and 38) along the piezoelectric medium toward output transducers 28, 30.

In keeping with the present invention, the multistrip couplers 24 and 26 are designed to launch surface acoustic waves 32, 34, 36 and 38 responsive to the detection of the input waves 20, 22 toward a pair of output transducers 28, 30. Each of these transducers 28, 30 are aligned with the multistrip couplers 24 and 26 to receive surface acoustic waves 32, 34 and 36, 38 which are directed into the respective output transducer 28, 30. The dotted line of FIG. 1 is intended to indicate the demarcation between phase shifted portions of the surface acoustic waves launched by the multistrip couplers 24 and 26.

Further in accordance with the present invention, one of the output transducers 28, 30 is provided with a phase shifting network 42 so that the outputs of the transducers 28, 30 are in phase. A simple matching network 40 is coupled to the parallel outputs of the transducers 28, 30 to provide a desired electronic output signal.

Figure 2:
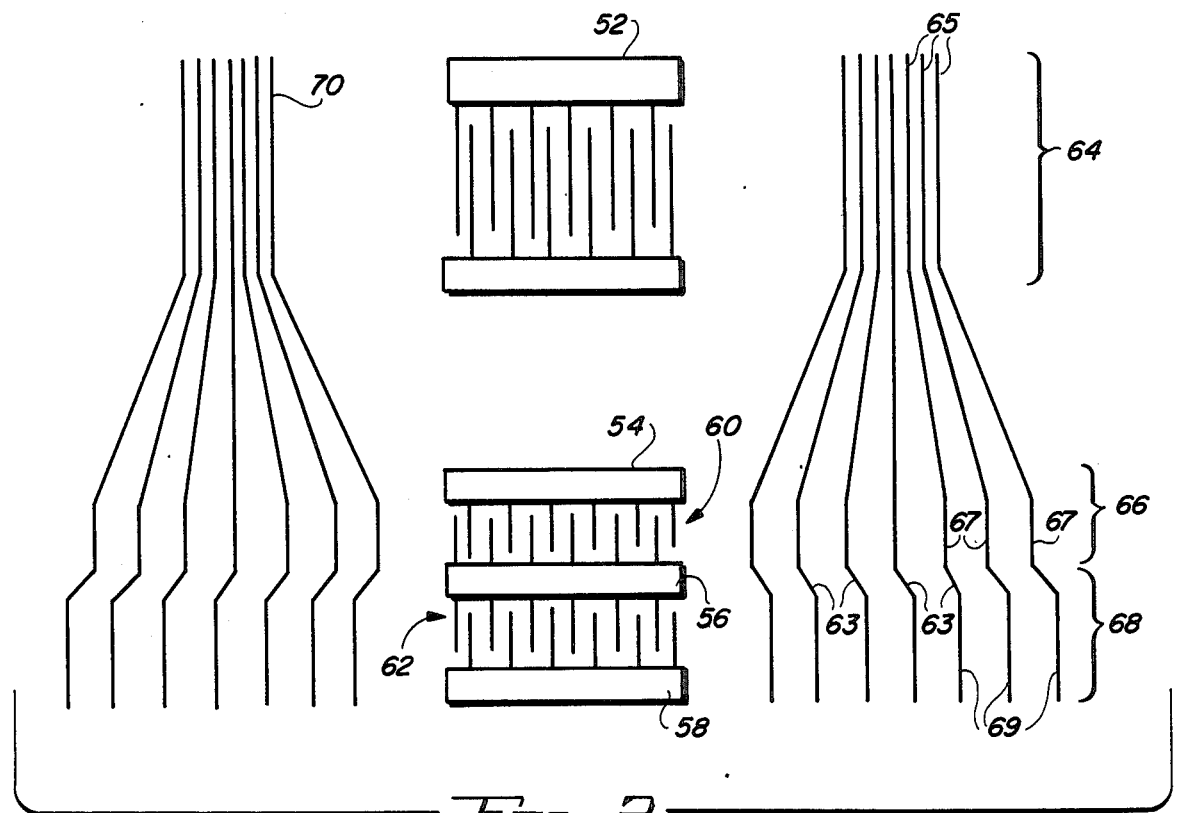
FIG. 2 is a schematic illustration of a specific embodiment of a surface acoustic wave device embodying the features shown and described with reference to FIG. 1.

FIG. 2 illustrates a specific embodiment of a surface acoustic wave device utilizing the phase shifting techniques described above with reference to FIG. 1. In FIG. 2, the reference numeral 50 refers generally to the surface acoustic wave device arranged on a piezoelectric surface; the metallization pattern of the transducers and the multistrip couplers are shown in FIG. 2 in order to highlight the manner in which phase shifting is obtained.

In FIG. 2, input transducer 52 launches bidirectional surface acoustic waves in the manner described above with reference to FIG. 1. As is shown on the right side of FIG. 2, a series of metallized strips 65 are generally parallel with each other and perpendicular to the direction of the surface acoustic wave front emitted from the input transducer 52. This area of parallel conductive strips 65 is shown generally as the first area 64 of the multistrip coupler.

The multistrip coupler further includes non-parallel strips 61 which extend away from the first area 64 to a second area 66 comprising a second series of parallel metal conductive strips 67. As is known, the electrical excitation of the conductive strips 65 in the first area 64 will result in the transmission of an electrical excitation along the non-parallel conductive strips 61 to the parallel portions 67 in the second area 66. This results in the generation of a surface acoustic wave in the direction of the first output transducer defined by metallization pads 54, 56 and interdigitated strips 60, as described in greater detail below.

The conductive strips 67 in the second area 66 are coupled via stips 63 to a third set of parallel metallic strips 69, arranged so as to launch a surface acoustic wave toward a second output transducer defined by metallization pads 56, 58 and interdigitated strips 62.

FIG. 2 also illustrates a second multistrip coupler 70 which is a mirror image of the first multistrip coupler defined by the three areas 64, 66 and 68. The SAW device 50 in FIG. 2 thus defines a surface acoustic wave ring device having a loop between the input transducer 52 to the output transducer 54, 58 with means for shifting by 90° a surface acoustic wave launched from a portion of the multistrip couplers. In FIG. 2, this is accomplished by the physical offset of the metallization of the strips 63 in the second and third areas 66 and 68, respectively. The physical spacing between the strips 67 in the second area and the strips 69 in the third area 68 may be adjusted to achieve the desired phase shifting configuration of 90° between the surface acoustic wave launched from the second area 66 and the surface acoustic wave launched from the third area 68. Similar dimensional characteristics of the second multistrip coupler 70 result in a phase shift between the surface acoustic waves received by the first and second output transducers of 90° from the opposite side. If any part of the acoustic power generated by one of the two multistrip couplers on either side is not completely absorbed by the pair of output transducers 28, 30, the power will be cancelled at the multistrip coupler on the opposing side because of the additional 90° phase shift provided. Similarly, any transducer reflections are cancelled because of the 180° total phase shift between portions of the acoustic wave front which are reflected back to the multistrip couplers. The electric output signal phase from the pair of output transducer 54, 58 may be adjusted by the use of a simple phase shifting network, as discussed above with reference to element 42 in FIG. 1.

FIGS. 3-6 inclusive, disclose various other multistrip coupler arrangements which are suitable to obtain the 90° phase shift discussed above. In each of FIGS. 3-6, it will be understood that while a single multistrip coupler arrangement is shown, that a second multistrip coupler having mirror symmetry with the coupler shown is utilized in the corresponding position as multistrip coupler 70 in FIG. 2.

Noting FIG. 3, the multistrip coupler 80 includes a set of parallel conductive strips 82 generally perpendicular to the surface acoustic wave 83 launched by the input transducer (not shown). The strips 82 are in turn coupled to additional parallel metallic strips 84, which serve the same function as the second area 66 in FIG. 2. Similarly, the multiple conductive strips 86 serve the same function as the third area 68 in FIG. 2. It can thus be seen that the 90° phase shift may be a phase shift in either acoustic direction by simply adjusting the dimensions of the conductive pattern of the multistrip coupler as it is deposited upon the piezoelectric surface.

FIG. 4 discloses a multistrip coupler configuration 90 employing a 3 dB multistrip coupler defined by parallel conductive strips 92, which are offset from the phase shifting conductive strips 94. The multistrip coupler 90 includes a coupled mirror configuration, including a first mirror pattern defined by curved conductive strips 96, and receiving mirror pattern defined by conductive strips 97. A "jog" 99 in the metallization pattern defines offset curved conductive strips 98 which are physically aligned with the offset strips 94 of the 3 dB multistrip coupler 92. The resulting multistrip coupler 90 receives the input acoustic wave 91 and divides that wave into two portions 93 and 95 which are 90° out of phase with respect to each other.

A similar phase shifting result is obtained in the multistrip coupler arrangement 100 shown in FIG. 5. In FIG. 5, a pair of 3 dB multistrip couplers 102 and 108 are offset one with respect to the other, and are employed together with opposed mirror patterns 104 and 106. This configuration results in an output surface acoustic waveform divided into two portions 107 and 109 with respect to the input surface acoustic wave 103, one portion 109 being 90° out of phase with the other portion 107.

In FIG. 6, there is shown a perpendicular multistrip coupler configuration 110 including a pair of opposed parallel coupling elements, the first element having a rectangular pair of conductive layers 102 and 104 responding to the input surface acoustic wave 103, and an output element defined by conductive patterns 106, 108 and 112, which have a "jog" 109 therein, to define the phase differential in the output surface acoustic wave portions 105 and 107.

Figure 7:
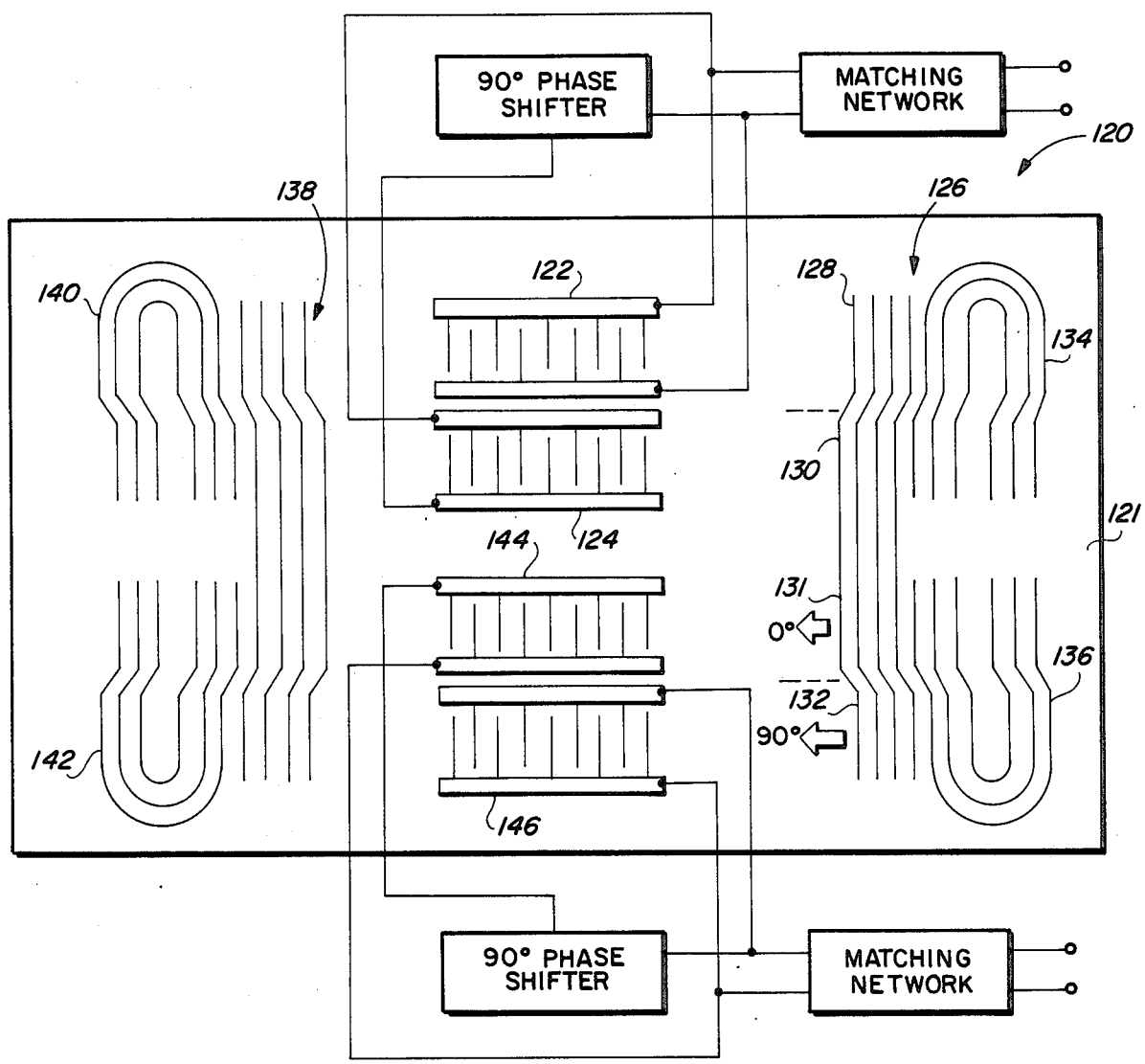
FIG. 7 is a schematic illustration of a split input transducer arrangement in accordance with the present invention.

FIG. 7 illustrates and alternative arrangement utilizing split input transducers in order to cancel spurious reflections back into the source of the input surface acoustic wave.

In FIG. 7, element 120 refers generally to a surface acoustic wave device arranged on a piezoelectric medium 121, with a pair of input transducers 122 and 124 positioned on the medium 121. In accordance with the discussions of FIGS. 1–6 above, the SAW device 120 further includes a pair of split output transducers 144 and 146.

In order to cancel undesirable reflections, a multistrip coupler arrangement is provided including multistrip coupler 126, having input sections 128 and 130 corresponding to, and opposite from, the respective input transducers 122, 124. The multistrip coupler 126 further includes portions 131 and 132 opposing the output transducers 144, 146 in the manner described above with reference to FIG. 2. Opposing mirror multistrip couplers 134 and 136 are also provided in a manner similar to that described above wtih reference to FIG. 4, except that there is a 90° phase shift along the input mirror 134. As is shown in FIG. 7, there is a symmetrical multistrip coupler 138, mirror 140 and 142 arrangement on the opposing side, in order that the SAW device 120 defines a ring loop arrangement in accordance with this invention.

The SAW device 120 of FIG. 7 thus provides a means for cancelling spurious reflections into the source of surface acoustic waves, by spreading the input transducers 122, 124 in a manner similar to the output transducers 144, 146 as described above. Any spurious reflections generated by the coupled-mirror multistrip coupler 134 is cancelled because of the additional 90° phase shift between the tracks of the input transducers 122, 124, as well as the 90° phase shift provided into the output transducers 144, 146.

As is further shown in FIG. 7, the surface acoustic wave may appropriately be connected to 90° phase shift circuits and matching networks in the same manner as is described above with reference to FIG. 1.

It will thus be understood that the present invention provides both a method for redirecting the power emitted from a bidirectional surface acoustic wave transducer so that the 3 dB loss due to directionality is eliminated, and a means of cancelling the triple-transit ripple otherwise incurred because of the circular power flow about the acoustic ring.

I claim:

1. A surface acoustic wave ring device on a piezoelectric medium, said device having input and output transducer means for launching and detecting a surface acoustic wave along first and second tracks from said input transducer means to said output transducer means and in a ring path along said piezoelectric medium, and means for cancelling any multiple transits of said surface acoustic wave, said cancelling means comprising means introducing a phase shift between portions of said surface acoustic wave along each of said first and second tracks between said input and output transducer means, said output transducer means adapted to receive said phase-shifted portions of said acoustic wave along both of said tracks.

2. A surface acoustic wave device comprising:
   (a) a piezoelectric medium;
   (b) input transducer means for launching a surface acoustic wave along first and second tracks on said medium from said input transducer means;
   (c) means introducing a phase shift between portions of said surface acoustic wave along each of said first and second tracks; and
   (d) two output transducers for receiving said phase-shifted portions of said surface acoustic wave along both of said first and second tracks.

3. A surface acoustic wave device comprising:
   (a) a piezoelectric medium;
   (b) input transducer means for launching a bidirectional acoustic wave along first and second tracks across said medium in generally opposite directions from said input transducer means;
   (c) output transducer means for detecting acoustic waves;
   (d) means for detecting said bidirectional wave along each track from said input transducer and redirecting said wave towards said output transducer means; and
   (e) means along each track from said input transducer means to said output transducer means for interposing a phase shift between two portions of said bidirectional wave in each track.

4. The surface acoustic wave device recited in claim 3 wherein said phase shift is 90°.

5. The surface acoustic wave device recited in claim 3 wherein said output transducer means comprises two transducers each for receiving only one of said portions of said redirected bidirectional wave.

6. The surface acoustic wave device recited in claim 5 wherein said input transducer means comprises two transducers for generating said surface acoustic wave.

7. The surface acoustic wave device recited in claim 5 further comprising:
   (a) means for receiving electrical outputs from said two output transducers representative of said phase shifted portions of said bidirectional wave; and
   (b) means for introducing a 90° phase shift between the electrical outputs of said output transducers so that both electrical outputs are in phase.

8. The surface acoustic wave device recited in claim 3 wherein said detecting means comprises multistrip coupling means.

9. The surface acoustic wave device recited in claim 8 wherein said multistrip coupling means includes multiple conductive strips arranged along said medium, said phase shift introducing means comprising an offset along said multiple strips of said multistrip coupling means, said offset being aligned to direct the phase shifted portion into said output transducer means.

10. The surface acoustic wave device recited in claim 9 wherein said multistrip coupling means includes a coupled mirror multistrip coupler arranged on said surface.

11. A surface acoustic wave ring device having means for cancelling multiple transits, said device comprising:
    (a) a piezoelectric medium;

(b) an input transducer arranged on said medium for launching a bidirectional acoustic wave in first and second directions along said medium;

(c) a first multistrip coupler having first, second and third areas arranged on said surface, said first area aligned for detecting an acoustic wave from said input transducer along said first direction, said second area coupled with, and responsive to detection in said first area of said acoustic wave in said first direction, and for launching an acoustic wave along said surface in a direction generally opposite to said first direction, said third area coupled with and responsive to detection in said first area of said acoustic wave in said first direction for launching an acoustic wave in a direction generally opposite to said first direction;

(d) means for interposing a phase shift between said acoustic waves launched from said second and third areas of said first multistrip coupler;

(e) a second multistrip coupler having first, second and third areas arranged on said surface, said first area aligned for detecting an acoustic wave from said input transducer along said second direction, said second area coupled with, and responsive to detection in said first area of said acoustic wave in said second direction, and for launching an acoustic wave along said surface in a direction generally opposite to said second direction, said third area coupled with and responsive to detection in said first area of said acoustic wave in said second direction for launching an acoustic wave in a direction generally opposite to said second direction;

(f) means for interposing a phase shift between said acoustic waves launched from said second and third areas of said second multistip coupler corresponding to said phase shift in said first multistrip coupler;

(g) a first output transducer arranged on said surface between said second area of said first multistrip coupler and said second area of said second multistrip coupler for detecting the acoustic waves launched therefrom; and (h) a second output transducer arranged on said surface between said third area of said first multistrip coupler and said third area of said second microstirp coupler for detecting the phase shifted acoustic waves launched therefrom.

12. The surface acoustic wave ring device recited in claim 11 further comprises:

(a) means for receiving electrical outputs from said first and second output transducers representative of said acoustic waves from said second and third areas of said first and second microstip couplers; and (b) means for introducing a phase shift between the electrical outputs of said first and second output transducers corresponding to said phase shift in said first and second multistrip couplers so that both electrical outputs are in phase.

13. The surface acoustic wave ring device recited in claim 11 wherein said phase shifting means comprises offsetting said third area on said medium with respect to said second area.

14. The surface acoustic wave ring device recited in claim 13 wherein said phase shifting means comprises a pair of opposed mirrored multistrip couplers.

15. The surface acoustic wave ring device recited in claim 13 wherein said phase shifting means further comprises an opposed pair of perpendicular multistrip couplers.

16. The surface acoustic wave ring device recited in claim 11 further comprising:

(a) said input transducer comprising two transducers; and (b) means for interposing a phase shift between portions of input surface acoustic waves launched by said two transducers.

17. The surface acoustic wave ring device recited in claim 16 wherein said phase shifts are all 90°.

18. A surface acoustic wave ring device having means for cancelling multiple transits, said device comprising:

(a) a piezoelectric medium;

(b) first and second input transducers for launching bidirectional acoustic waves along said medium in generally opposite directions from said input transducers;

(c) first and second output transducers for detecting bidirectional acoustic waves;

(d) means for detecting said bidirectional surface acoustic waves in each direction from said first and second input transducers and redirecting said surface acoustic waves toward said first and second output transducers; and (e) means along a track from said first and second input transducers to said first and second output transducers for interposing a phase shift between two portions of said bidirectional surface acoustic waves, in order to cancel multiple transits therein.

19. A method for reducing loss in a surface acoustic wave ring device and for cancelling multiple transits therein, said method comprising the steps of:

(a) providing a surface acoustic wave ring device having input and output transducers and a ring loop having two tracks between said input and output transducers; and (b) introducing a phase shift between portions of a surface acoustic wave along each track between said input and output transducers, in order to cancel multiple transits therein.

* * * * *